(12) United States Patent
Naito et al.

(10) Patent No.: US 9,763,320 B2
(45) Date of Patent: Sep. 12, 2017

(54) TRANSPARENT CONDUCTOR AND DEVICE

(71) Applicant: KABUSHIKI KAISHA TOSHIBA, Minato-ku, Tokyo (JP)

(72) Inventors: Katsuyuki Naito, Tokyo (JP); Norihiro Yoshinaga, Kanagawa (JP); Tianyi Yang, Kanagawa (JP); Yoshihiro Akasaka, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/639,318

(22) Filed: Mar. 5, 2015

(65) Prior Publication Data

US 2015/0257258 A1 Sep. 10, 2015

(30) Foreign Application Priority Data

Mar. 5, 2014 (JP) .................................. 2014-042574

(51) Int. Cl.

| | | |
|---|---|---|
| H01L 29/22 | (2006.01) |
| H05K 1/02 | (2006.01) |
| H01L 33/48 | (2010.01) |
| H01L 33/62 | (2010.01) |
| H05K 1/14 | (2006.01) |
| H01L 33/42 | (2010.01) |

(52) U.S. Cl.
CPC .......... *H05K 1/0274* (2013.01); *H01L 33/42* (2013.01); *H01L 33/486* (2013.01); *H01L 33/62* (2013.01); *H05K 1/144* (2013.01); *H05K 2201/0108* (2013.01); *H05K 2201/0323* (2013.01); *H05K 2201/0379* (2013.01)

(58) Field of Classification Search
CPC ....... H01L 33/42; H01L 33/62; H01L 33/486; H05K 1/144; H05K 1/0274
USPC .......................................... 257/99, 100, 103
See application file for complete search history.

(56) References Cited

U.S. PATENT DOCUMENTS

| | | | |
|---|---|---|---|
| 2008/0157235 A1 | 7/2008 | Rogers et al. |
| 2010/0275477 A1 | 11/2010 | Kim |
| 2010/0283069 A1 | 11/2010 | Rogers et al. |

(Continued)

FOREIGN PATENT DOCUMENTS

| | | |
|---|---|---|
| CN | 102211207 A | 10/2011 |
| CN | 102737755 A | 10/2012 |

(Continued)

OTHER PUBLICATIONS

Jiajie Liang et al., "Silver nanowire Percolation Network Soldered with Graphene Oxide at Room Temperature and Its Application for Fully Stretchable Polymer Light-Emitting Diodes", ACS NANO, vol. 8, No. 2, Jan. 28, 2014, pp. 1590-1600.

(Continued)

*Primary Examiner* — Hung Vu
(74) *Attorney, Agent, or Firm* — Finnegan, Henderson, Farabow, Garrett & Dunner, L.L.P.

(57) ABSTRACT

According to one embodiment, a transparent conductor includes a transparent substrate; a metal nanowire layer disposed on the transparent substrate and including a plurality of metal nanowires; a graphene oxide layer covering the metal nanowire layer; and an electrical insulating resin layer disposed in contact with the graphene oxide layer.

6 Claims, 6 Drawing Sheets

(56) References Cited

U.S. PATENT DOCUMENTS

| | | | |
|---|---|---|---|
| 2012/0132930 A1* | 5/2012 | Young | H01L 31/0481 257/84 |
| 2012/0249829 A1 | 10/2012 | Izuha et al. | |
| 2012/0258334 A1 | 10/2012 | Kaneko et al. | |
| 2013/0048339 A1 | 2/2013 | Tour et al. | |
| 2013/0078436 A1 | 3/2013 | Naito et al. | |
| 2013/0081678 A1 | 4/2013 | Naito et al. | |
| 2013/0168138 A1 | 7/2013 | Yamazaki et al. | |
| 2013/0306361 A1* | 11/2013 | Kim | H05K 1/097 174/257 |
| 2014/0313562 A1* | 10/2014 | Ruoff | G02F 1/155 359/265 |

FOREIGN PATENT DOCUMENTS

| | | |
|---|---|---|
| JP | 2008-34473 | 2/2008 |
| JP | 2008-507001 | 3/2008 |
| JP | 2009-146678 | 7/2009 |
| JP | 2012-51993 | 3/2012 |
| JP | 2012-84855 | 4/2012 |
| JP | 2012-216760 | 11/2012 |
| JP | 2013-73748 | 4/2013 |
| JP | 2013-80565 | 5/2013 |
| JP | 2014-7147 | 1/2014 |
| KR | 10-1301480 | 8/2013 |
| WO | WO 2012/005205 A1 | 1/2012 |

OTHER PUBLICATIONS

Iskandar N. Kholmanov et al., "Reduced Graphene Oxide/Copper Nanowire Hybrid Films as High-Performance Transparent Electrodes", ACS NANO, vol. 7, No. 2, Jan. 29, 2013, pp. 1811-1816.

Extended European Search Report, dated Jul. 7, 2015, in counterpart European Application No. 15157129.6-1551.

Young Soo Yun, "Transparent Conducting Films Based on Graphene Oxide/Silver Nanowire Hybrids with High Flexibility", Synthetic Metals, 2012, vol. 162, pp. 1364-1368.

Mi-Sun Lee, et al., "High Performance, Transparent, and Stretchable Electrodes Using Graphene-Metal Nanowire Hybrid Structures", Nano Letters, 2013, vol. 13, pp. 2814-2821.

I. K. Moon, et al., "2D Grahene Oxide Nanosheets as an Adhesive Over-Coating Layer for Flexible Transparent Conductive Electrodes", Scientific Reports, Sungkyunkwan Univ., 2013, pp. 1-7.

First Office Action issued by the State Intellectual Property Office of China on Jun. 20, 2016, in counterpart Chinese Patent Application No. 201510098288.5.

* cited by examiner

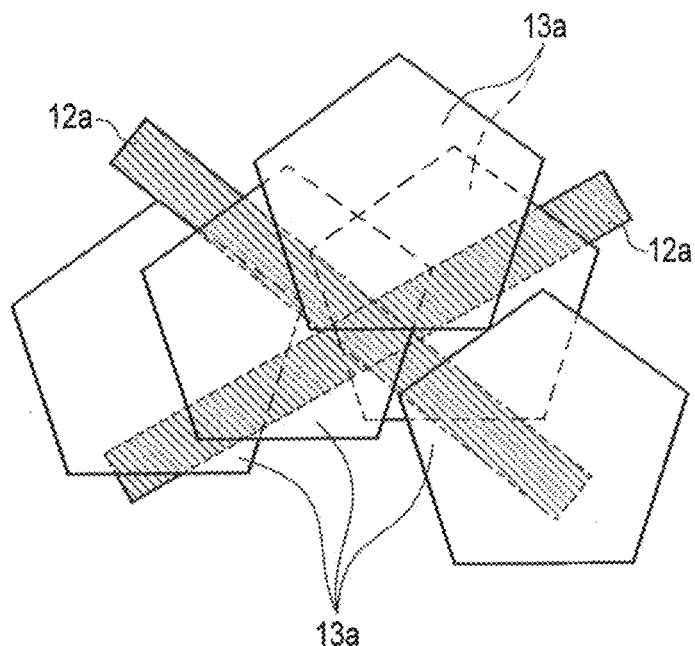
F I G. 2A
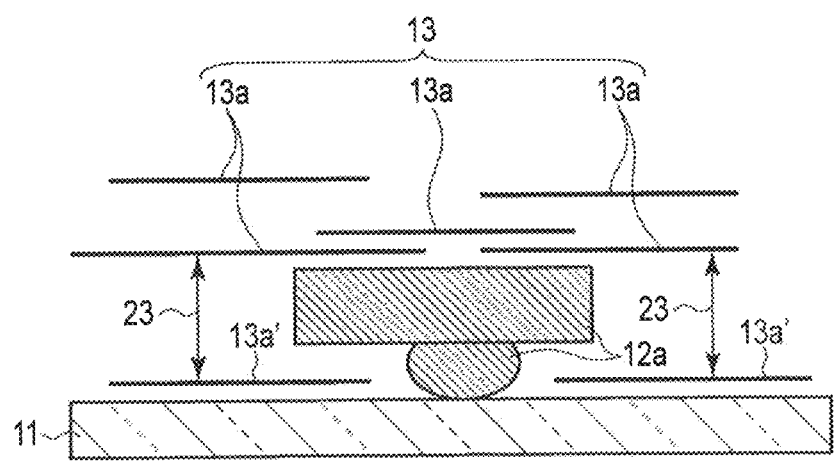
F I G. 2B

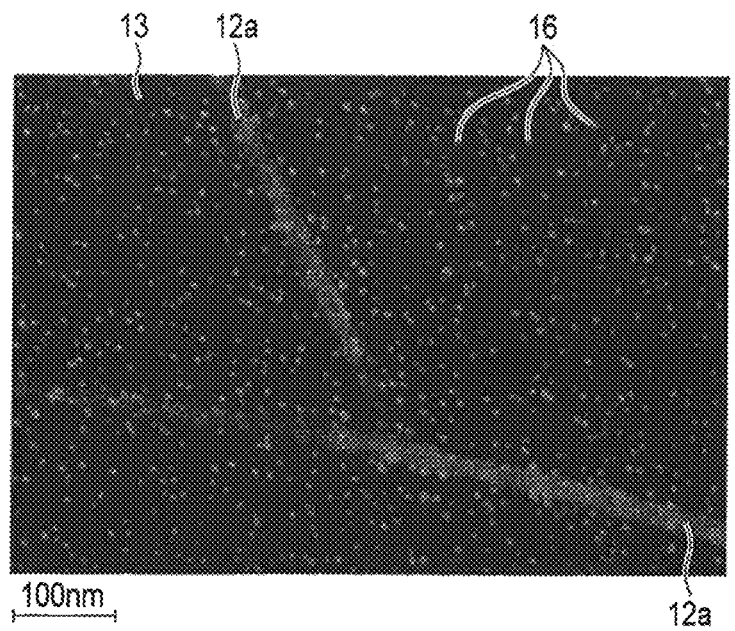
F I G. 7A
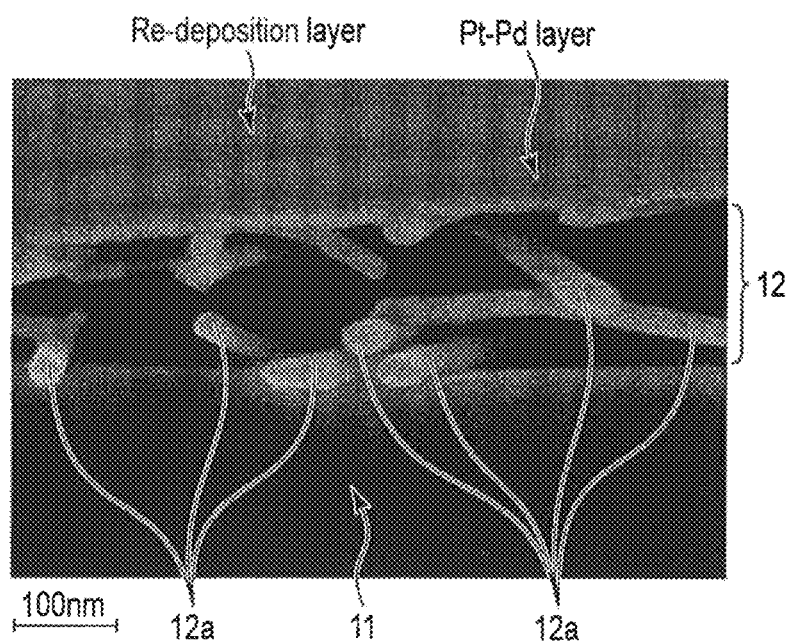
F I G. 7B

TRANSPARENT CONDUCTOR AND DEVICE

CROSS-REFERENCE TO RELATED APPLICATION

This application is based upon and claims the benefit of priority from Japanese Patent Application No. 2014-042574, filed Mar. 5, 2014 the entire contents of which are incorporated herein by reference.

FIELD

Embodiments described herein relate generally to a transparent conductor and a device that uses the transparent conductor.

BACKGROUND

Conventionally, devices using a transparent conductive film have been developed. Examples of such devices include liquid crystal display devices, solar cells, organic EL devices, optical devices such as inorganic light-emitting diodes (inorganic LED), and coordinate panels referred to as touch panels. Indium-tin oxide (ITO) films are generally used as transparent electrodes or transparent wiring in these devices. The transparent wiring usually has a very long total length and therefore requires flexibility. ITO is, however generally brittle and apt to be cracked by bending or other stress. Cracking of the ITO film leads to an increase in electrical resistance.

The use of carbon materials (a carbon fiber, a carbon nanotube, graphene, or the like) as a conductive material can significantly reduce the amount of rare metals or the like to be used. In some cases, the use of carbon materials even enables no metals or the like to be used. Carbon materials have high flexibility and large mechanical strength, and in addition, are chemically stable. Although individual molecules of carbon materials have comparatively high conductivities, the resistance in intermolecular conduction is high. For this reason, when carbon materials are used as a transparent electrode having a large area, the electrical resistance is higher compared to an ITO film of the same light transmittance. When carbon materials are used for wiring with a long total length, the electrical resistance is much higher than that when a metal conductive material such as copper (Cu) is used.

Since a metal nanomaterial has high conductivity, development for improving the conductivity of carbon materials by using a composite of the carbon materials and metal nanomaterial is underway. However, even when the composite is used, it is difficult to obtain a transparent conductor which has high transparency, is excellent in resistance to bending, peeling, and impurities, and is obtainable at low cost.

BRIEF DESCRIPTION OF THE DRAWINGS

FIGS. 2A and 2B are schematic views showing the fusing of metal nanowires due to the graphene oxide layers in a transparent conductor according to an embodiment;

FIGS. 7A and 7B are scanning electron microscope (SEM) images of a transparent conductor of an example.

DETAILED DESCRIPTION

According to one embodiment, a transparent conductor includes a transparent substrate; a metal nanowire layer disposed on the transparent substrate and including a plurality of metal nanowires; a graphene oxide layer covering the metal nanowire layer; and an electrical insulating resin layer disposed in contact with the graphene oxide layer.

Hereinafter, the embodiment will be described with reference to the drawings.

It is difficult to further enhance transparency and bending resistance, and to further decrease electrical resistance in a light-emitting device in which an inorganic LED and an acrylic resin layer are arranged on a transparent ITO film. A device is known, in which the device is obtained by sandwiching an inorganic LED between polyethylene terephthalate (PET) films, wherein the PET films have a layer produced by chemical vapor deposition (CVD) and including graphene and a layer including silver nanowire laminated thereon. Such a device has low transmissivity and requires high cost. A touch panel using a silver nanowire has poor peeling resistance. Therefore, in such a touch panel, it is difficult to secure resistance against impurities, sulfur in particular.

The present inventors found a transparent conductor that is low in electrical resistance and can be provided at low cost, the transparent conductor having high transparency and being excellent in resistance to bending, peeling, and impurities.

Figure 1:
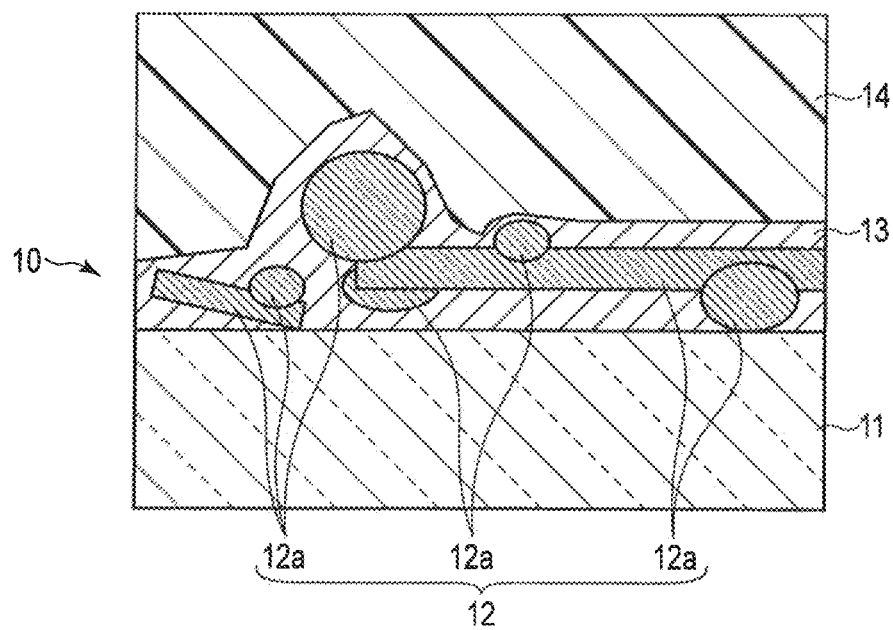
FIG. 1 is a schematic view showing a cross-section of a transparent conductor according to an embodiment.

FIG. 1 is a schematic cross-sectional view of a transparent conductor 10 according to an embodiment. A metal nanowire layer 12 including an aggregate of metal nanowires 12a, and a graphene oxide layer 13 are provided on a transparent substrate 11. The metal nanowire layer 12 includes a plurality of metal nanowires 12a. In the metal nanowire layer 12, a gap may be produced between adjacent metal nanowires that are spaced apart from each other. In this gap, the graphene oxide layer 13 is in contact with the substrate 11. Furthermore, an electrical insulating resin layer 14 is arranged in contact with the graphene oxide layer 13.

In the transparent conductor 10, parts of the plurality of metal nanowires 12a are in contact with or fused to each other, forming a network-like structure, such as a net-like structure or a lattice-like structure. Thus, a plurality of conductive paths is formed, and a conductive cluster spanning the entire transparent conductor is formed (percolation theory). In order to form the conductive cluster, a certain amount of number density is required of the metal nanowire. In general, a longer metal nanowire is more likely to form the conductive cluster, and a metal nanowire having a larger diameter has a higher conductivity. Since a network-like structure using the metal nanowires is formed as such, the conductive cluster exhibits high conductivity as a whole, although the amount of metal is small. In addition, the obtained metal nanowire layer 12 is flexible.

Graphene oxide can be manufactured from inexpensive graphite, and the graphene oxide layer 13 is flexible and transparent. The graphene oxides have high bonding properties and adhesive properties due to hydrogen bonding. Therefore, the graphene oxide functions to fuse the metal nanowires 12a to each other, thereby enhancing the conductivity of the metal nanowire layer 12, and at the same time improves thermal stability and mechanical stability. With reference to FIGS. 2A and 2B, the fusion of the metal nanowires 12a caused by the graphene oxide will be described. FIG. 2A is a schematic view of the metal nanowire 12a and graphene 13a in the transparent conductor of the embodiment as viewed from above. FIG. 2B is a schematic cross-sectional view. A portion of the graphene oxides 13a is in contact with the substrate 11 and are labeled as graphene oxides 13a'. Herein, the metal nanowire 12a is sandwiched between the graphene oxides 13a and 13a'. The fusion of the metal nanowires 12a is caused by a strong bonding force 23 between the graphene oxides.

Furthermore, the graphene oxide 13a has various effects. For example, the graphene oxide 13a is a layered substance, and has an effect of preventing the diffusion of impurities from outside. Particularly, although the silver nanowire may be corroded by sulfur and compounds thereof, the corrosion can be prevented by the effect of the graphene oxide.

The graphene oxide 13a itself has insulating properties. However, when the graphene oxide is applied with a voltage to pass an electric current, a part of the graphene oxide changes to graphene, and thereby allowing the value of electrical resistance to be decreased. For this reason, good contact between the graphene oxide layer and an electric element is obtained. The graphene oxide 13a can also dissolve a part of the metal nanowires 12a to promote the fusion of the metal nanowires 12a and can precipitate the dissolved metal as nanoparticles. The adhesion between the graphene oxide and an electrical insulating resin is also good, and the adherence of the graphene oxide to a resin having a polar group is particularly excellent.

In the transparent conductor of the present embodiment, when a stack including the metal nanowire layer 12, the graphene oxide layer 13, and the insulating resin layer 14 is patterned, the transparent conductor can be used for electric wiring. The electric wiring obtained by patterning a transparent conductive film of the present embodiment has high transparency, and is excellent in resistance to bending, peeling, and impurities, is obtainable at low cost, and has low electrical resistance. Thus, a device having such an electric wiring has high transparency and is excellent in resistance to bending, peeling, and impurities. In addition, the device is advantageous also in that the device is low in electrical resistance and can be manufactured at low cost.

In general, a metal wire having a diameter of about 10 to 500 nm and an average length of about 0.1 to 50 µm is referred to as a metal nanowire. The diameter of the metal nanowire can be measured by a scanning electron microscope (SEM), for example. The average length of the metal nanowire can be determined by analyzing an SEM image, for example.

In the present embodiment, the diameter of the metal nanowire 12a is preferably 20 to 150 nm, and more preferably 30 to 120 nm. When the average length of the metal nanowire is too short, a sufficient conductive cluster is not formed, causing the electrical resistance to become high. Meanwhile, when the average length of the metal nanowire is too long, the dispersion of the metal nanowire in a solvent during the manufacture of an electrode becomes unstable. The average length of the metal nanowire is preferably 1 to 100 µm, and more preferably 5 to 40 µm.

The metal nanowire 12a is preferably a silver nanowire. Silver has the smallest electrical resistance, and is relatively stable even towards oxygen or water. From the aspect of the price of the metal nanowire, a copper nanowire is also preferable. The metal nanowire may be made of an alloy, and may have a surface subjected to plating using nickel or the like.

The metal nanowire 12a can be manufactured by reducing a metal ion in an aqueous solution using various reducing agents. By selecting the type of the reducing agent, protective polymer, and coexisting ions used during manufacture, the shape and size of the metal nanowire can be controlled. In order to manufacture the silver nanowire, it is preferable that a polyhydric alcohol such as ethylene glycol is used as the reducing agent, and polyvinylpyrrolidone is used as the protective polymer. Nano order sized wires, so-called nanowires, can be obtained by using such raw materials.

The metal nanowire layer 12 can be formed by applying the dispersion of the metal nanowire 12a in a liquid onto the transparent substrate 11. A method for applying the dispersion can be selected from a spin coat method, a spray coat method, an applicator coat method, or the like. The metal nanowires may be fused to each other by a method such as heating the metal nanowire layer produced on the transparent substrate 11 at a temperature of 100° C. or more, or pressing the metal nanowire layer by a pressing machine. In such a case, the conductivity of the metal nanowire layer is further enhanced. A metal nanowire layer may be produced by using metal nanowires having different diameters and materials. Thereby, sheet resistance, total light transmissivity, light reflectivity, a Haze value, or the like can be changed.

The graphene oxide 13a in the present embodiment is preferably planate graphene oxide obtained by oxidizing graphite. The graphene oxides 13a are stacked to constitute the graphene oxide layer 13. When the number of the graphene oxide layers is too small, resistance to impurities is not sufficiently obtained. When the number of the graphene oxide layers is excessive, an increase in electrical resistance is of concern. The number of the graphene oxide layers is preferably 2 to 100, and more preferably 3 to 30.

The graphene oxide layer 13 can be formed by applying a dispersion obtained by dispersing graphene oxide in a polar solvent, followed by drying. A basic compound, for example, ammonia, amines, sodium hydroxide, or the like may be added into the polar solvent, if needed, in order to improve the dispersibility of the graphene oxide. The graphene oxide layer 13 may be a single layer or a multilayer including 2 to 5 layers. When the diameter of the graphene oxide is too small, the resistance to impurities is insufficient. When the diameter of the graphene oxide is excessive, the dispersibility of the graphene oxide in the polar solvent is deteriorated, making it difficult to form an applied film that is uniform. The diameter of the graphene oxide 13a is preferably 100 nm to 10 µm, and more preferably 300 nm to 4 µm.

The diameter of the plate-like graphene oxide is defined as a diameter of a circle having an area equal to the area of the plate. This diameter can be determined by analyzing an SEM image, for example.

When an oxygen content in the graphene oxide is too small, light absorption is increased, providing insufficient transparency. Meanwhile, when the oxygen content in the graphene oxide is excessive, there is a concern that the barrier property against impurities may decrease. The oxygen content in the graphene oxide is preferably 10 to 150% of the number of carbon atoms, and more preferably 30 to 120%.

The graphene oxide layer 13 may include metal nanoparticles within the graphene oxide layer 13 or on the surface thereof. Contacts between the graphene oxide 13a and the metal nanowire 12a and between the graphene oxide layer 13 and the electric element are improved by including the metal nanoparticles. The metal nanoparticles are preferably made of the same metal as that of the metal nanowire. When process conditions are properly adjusted, the chemical reaction between the metal nanowire and the graphene oxide allows the metal nanoparticles to be produced without separately adding the metal nanoparticles.

When the diameter of the metal nanoparticle is too small, the stability of the nanoparticle is insufficient. When the diameter of the metal nanoparticle is excessive, an effect of a contact improvement cannot be sufficiently obtained. When the metal nanoparticle having a large particle diameter is generated from the metal nanowire, the diameter of the metal nanowire serving as the raw material is decreased. In the case of a transparent conductor in which the metal nanoparticle having a large particle diameter is present, the transparent conductor is apt to be short-circuited when applied to a touch panel. From these considerations, the diameter of the metal nanoparticle is preferably about 1 to 50 nm, and more preferably 3 to 20 nm.

The electrical insulating resin layer 14 can be formed of a thermoplastic, thermosetting or light, curing transparent resin. A resin having a polar group is preferably used, since then the adhesion between the resin layer 14 and the graphene oxide layer 13 is enhanced. Particularly preferred is a resin having a carbonyl group, which is likely to bond with an —OH group of the graphene oxide through hydrogen bonding.

Among the resins described above, the thermoplastic resin or the light curing resin is particularly preferable. A production process using the thermoplastic resin is easy. The thermoplastic resin is particularly suitable for applications requiring flexibility. For example, an acryl-based elastomer, a styrene-based elastomer, an olefin-based elastomer, a vinyl chloride-based elastomer, a urethane-based elastomer, and an amide-based elastomer are used as the thermoplastic resin. The acryl-based elastomer, urethane-based elastomer, and amide-based elastomer, having a carbonyl group, are preferable.

The light curing resin is cured in a short time, enabling a process time for device production to be shortened. Although the curing in a short time is apt to cause strain in the resin, layer, the metal nanowire layer and the graphene oxide layer in the present embodiment are flexible, and can endure the strain. The graphene oxide functions also as a photopolymerization initiator for a vinyl monomer. As the light curing resin, a resin that is cured by ultraviolet light is preferable. Examples thereof include an acrylate radical polymerization-based resin and an epoxy cation polymerization-based resin. The acrylate-based resin is more preferable. After light irradiation, the light curing resin may be subjected to a post-annealing treatment.

The material of the transparent substrate 11 can be selected from a resin and glass. However, from the aspects of flexibility and low cost, the material is preferably an electrical insulating resin. Examples of the resin include polyethylene terephthalate (PET), polyethylene naphthalate (PEN), polycarbonate (PC), polyimide (PI), polyether sulphone (PES), a cyclic olefin resin (for example, ARTON or the like), and polymethylmethacrylate (PMMA). PET is the most preferable considering its particularly high mechanical strength and transparency, and its particularly low cost. The thickness of the transparent substrate 11 is preferably about 50 µm to 200 µm.

An antireflective film and a hard coat layer may be provided outside the substrate 11 made of PET. In order to form the antireflective film, for example, an inorganic material such as $MgF_2$ and LiF, fluoride-based polymers, graphene oxide, or the like, which are low in refractive index can be used. In order to form the hard coat layer, an inorganic oxide such as $SiO_2$, a polyfunctional acrylic resin, or the like can be used, for example.

The hard coat layer is effective also as a barrier layer against oxygen, water vapor, or corrosive gases such as hydrogen sulfide. A binder layer may be provided on a surface of the hard coat layer that is in contact with the metal nanowire 12a in order to strengthen the bond between the hard coat layer and the metal nanowire 12a. The binder layer can be formed by using polyvinyl alcohol, polyvinylpyrrolidone, graphene oxide, or the like, for example. Since interaction with the upper graphene oxide layer becomes stronger, it is most preferable to use the graphene oxide itself as the binder. In this case, the structure and oxygen content of the graphene oxide used for the binder may be different from those of the graphene oxide of the graphene oxide layer 13. In order to enhance the adhesion between the binder layer and the PET film, the oxygen content of the graphene of the binder layer is preferably smaller than that of the upper graphene oxide layer 13.

The graphene oxide layer 13 may include nitrogen atoms. The nitrogen atoms can be mixed into the graphene oxide layer 13 by adding a starting material for the nitrogen atoms into a solvent dispersion that is the raw material for the graphene oxide layer 13. Examples of the starting material include ammonia, amine compounds, hydrazine, and hydrazine compounds. When the nitrogen atoms are present in the graphene oxide layer, the binding between the graphene oxide layer and the metal nanowire is further strengthened.

When the graphene oxide layer 13 includes the nitrogen atoms in an amount of at least 0.1% of the carbon atoms, the effect of the nitrogen atoms can be obtained. The amount of the nitrogen atoms in the graphene oxide layer 13 is more preferably 0.2% or more of the carbon atoms. Meanwhile, when the amount of the nitrogen atoms in the graphene oxide layer 13 is excessive, there is a concern that the binding force between the graphene oxides themselves may decrease. The amount of the nitrogen atoms is preferably 10% or less of the carbon atoms, more preferably 6% or less, and most preferably about 0.2 to 4%.

The ratio (O/C) of the carbon atoms and oxygen atoms or the ratio (N/C) of the carbon atoms and nitrogen atoms can be measured by X-ray photoelectron spectroscopy (XPS). The signal sensitivity varies depending on the device. The signal strength of each element can be adjusted by using a material of known composition as a reference substance. An example of the standard substance of the ratio (N/C) of the carbon atoms and nitrogen atoms is carbon nitride, which has a composition ratio of $C_3N_4$.

When the transparent conductor of the present embodiment is used for electric wiring, the sheet resistance of a portion that becomes the electric wiring is preferably 10Ω/□ or less. If the sheet resistance is greater than 10Ω/□, when applying the electric wiring to an element having a large area of A4 size (ISO 216) or more, there is a concern that electrical resistance in the wiring may become great and thereby increasing the drive voltage.

A part of the graphene oxide layer 13 is preferably present between the metal nanowire 12a and the transparent substrate 11. In this case, the same effect as that of the above-mentioned binder layer is obtained. Particularly, when the substrate 11 is made of a resin including an aromatic ring such as PET, PEN, and polycarbonate, the aromatic ring in the resin interacts with the aromatic ring in the graphene oxide, and thereby the adhesion between the substrate 11 and the graphene oxide layer 13 is enhanced. As a result, the adhesion between the metal nanowire 12a and the substrate 11 is also improved.

Figure 3:
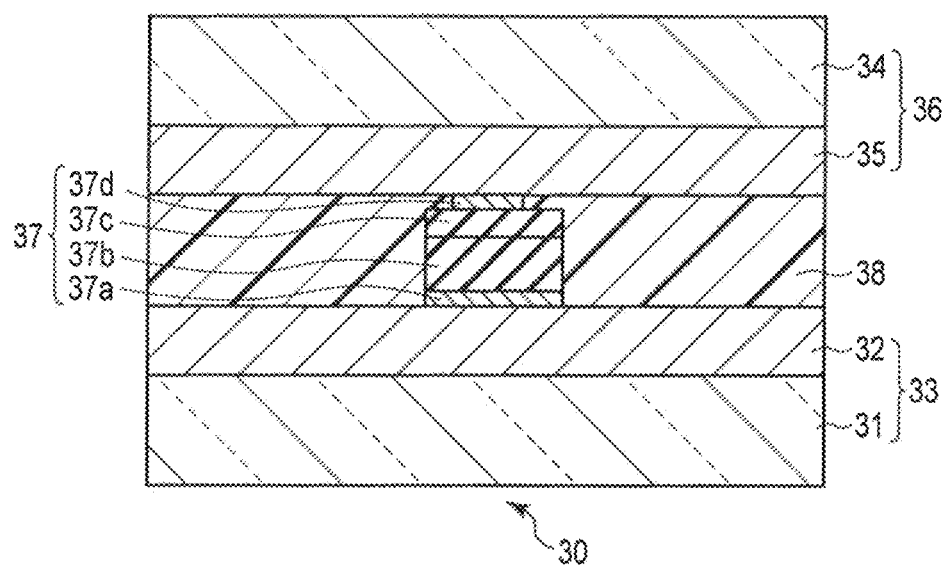
FIG. 3 is a schematic cross-sectional view of a light-emitting device according to an embodiment.

FIG. 3 shows the configuration of a photoelectric conversion device, which includes a photoelectric conversion element, according to an embodiment. More specifically, a light-emitting device is shown as the photoelectric conversion device, in which the photoelectric conversion element is a light-emitting element. A light emitting device 30 shown in FIG. 3 includes a first support 33 having a light-transmission property, the first support 33 including a first transparent substrate 31 and a first conductive layer 32 disposed on the first transparent substrate 31; a second support 36 including a second substrate 34 and a second conductive layer 35 disposed on the second substrate 34, the second conductive layer 35 being spaced apart and faced to the first conductive layer 32; a light-emitting element 37 including a semiconductor layer (an n-type semiconductor layer 37b and a p-type semiconductor layer 37c), and a first electrode 37a and a second electrode 37d arranged on the semiconductor layer, the light-emitting element 37 positioned between the first support 33 and the second support 36, wherein the first electrode 37a is electrically connected to the first conductive layer 32, and the second electrode 37d is electrically connected to the second conductive layer 35; and an electrical insulating resin layer 38 that is in contact with the first conductive layer 32 and the second conductive layer 35. The first conductive layer 32 includes a metal nanowire layer including a plurality of metal nanowires and a graphene oxide layer covering the metal nanowire layer.

In other words, in the light-emitting device 30, the light-emitting element 37 is sandwiched between the first support 33 and the second support 36, and the electrical insulating resin layer 38 is positioned in a region between the two supports and surrounding the light-emitting element.

The first support 33 includes a first transparent substrate 31 and a first conductive layer 32 disposed on the first transparent substrate 31. The second support 36 includes a second substrate 34 and a second conductive layer 35 disposed on the second substrate 34. The first conductive layer 32 and the second conductive layer 35 are faced to each other. The transparent substrate as already described is used as the first substrate 31. The transparent resin as already described is used as the electrical insulating resin layer 38.

The first conductive layer 32 includes a metal nanowire layer including a plurality of metal nanowires, and a graphene oxide layer covering the metal nanowire layer. It is preferable that the second substrate is transparent, and the second conductive layer 35 includes a metal nanowire layer including a plurality of metal nanowires and a graphene oxide layer covering the metal nanowire layer.

The first conductive layer 32 and the second conductive layer 35 may be patterned. The patterned first conductive layer 32 and second conductive layer 35 can be arranged so that they cross each other.

The light-emitting element 37 is preferably an inorganic LED. The light-emitting element 37 includes an n-side electrode 37a, an n-type semiconductor layer 37b, a p-type semiconductor layer 37c, and a p-side electrode 37d which are sequentially stacked. The n-side electrode 37a in the light-emitting element 37 is electrically connected to the first conductive layer 32. The p-side electrode 37d is electrically connected to the second conductive layer 35. A conductive adhesive layer may be provided between the n-side electrode 37a and the first conductive layer 32, and between the p-side electrode 37d and the second conductive layer 35. The antireflection layer and hard coat layer described above are preferably provided on the surface of the light-emitting device 30 (surfaces of the first substrate 31 and second substrate 34). The circumference of the light-emitting device 30 is preferably sealed to prevent the invasion of corrosive gas.

Figure 4:
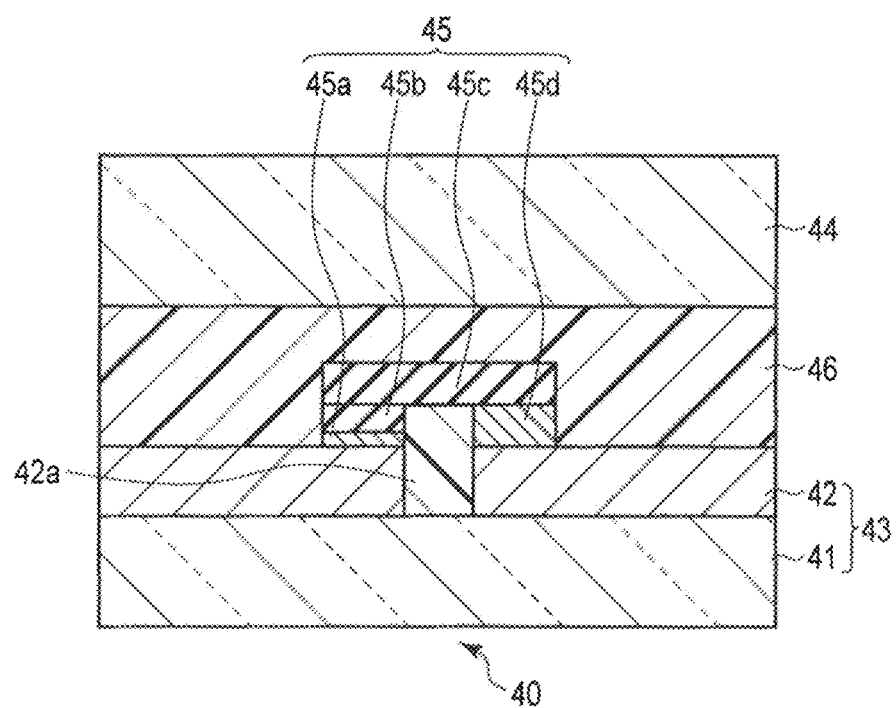
FIG. 4 is a schematic cross-sectional view of a light-emitting device according to another embodiment.

A photoelectric conversion device, which includes a photoelectric conversion element, according to another embodiment is shown in FIG. 4. More specifically, a light-emitting device is shown as the photoelectric conversion device, in which the photoelectric conversion element is a light-emitting element. A light-emitting device 40 shown in FIG. 4 includes: a first support 43 having a light-transmission property, the first support 43 including a first transparent substrate 41 and a segmented conductive layer 42 disposed on the first transparent substrate 41; a second support 44 spaced apart from and faced to the segmented conductive layer; a light-emitting element 45 including a semiconductor layer (an n-type semiconductor layer 45b and a p-type semiconductor layer 45c), and a first electrode 45a and a second electrode 45d disposed on the semiconductor layer and spaced apart from each other, the light-emitting element 45 being positioned between the first support 43 and the second support 44, wherein the first electrode 45a and the second electrode 45d are electrically connected to different segments of the segmented conductive layer 42; and an electrical insulating resin layer 46 that is in contact with the segmented conductive layer 42 and the second support 44. The segmented conductive layer 42 includes a metal nanowire layer including a plurality of metal nanowires and a graphene oxide layer covering the metal nanowire layer.

In other words, in the light-emitting device 40, the light-emitting element 45 is sandwiched between the first support 43 including the first substrate 41 and the second support 44. The light-emitting element 45 is embedded in the electrical insulating resin layer 46. The first support 43 includes the segmented conductive layer 42 disposed on the first substrate 41. The segmented conductive layer 42 is faced to the second support 44. The transparent substrate as already described is used as the first substrate 41. The transparent resin as already described is used as the electrical insulating resin layer 46.

The segmented conductive layer 42 includes a metal nanowire layer including a plurality of metal nanowires and a graphene oxide layer covering the metal nanowire layer. The segmented conductive layer 42 has a spacing 42a. An electrical insulating resin is positioned in the spacing 42a.

The light-emitting element 45 is preferably an inorganic LED. The light-emitting element 45 includes a p-type semiconductor layer 45c and an n-type semiconductor layer 45b covering a part of the p-type semiconductor layer 45c. An n-side electrode 45a is disposed on the n-type semiconductor layer 45b. A p-side electrode 45d is disposed on the p-type semiconductor layer 45c which is not covered with the n-type semiconductor layer 45b. The n-side electrodes 45a and the p-side electrode 45d are electrically connected to different segments of the segmented conductive layer 42. A conductive adhesive layer may be provided between the n-side electrode 45a and the segmented conductive layer 42, and between the p-side electrode 45d and the segmented conductive layer 42. The n-side electrode 45a and the p-side electrode 45d are electrically insulated by the electrical insulating resin positioned in the spacing 42a of the segmented conductive layer 42. The antireflection layer and hard coat layer described above are preferably provided on the surface of the light-emitting device 40 (surfaces of the first substrate 41 and the second support 44). The circumference of the light-emitting device 40 is preferably sealed to prevent the invasion of corrosive gas.

Figure 5A:
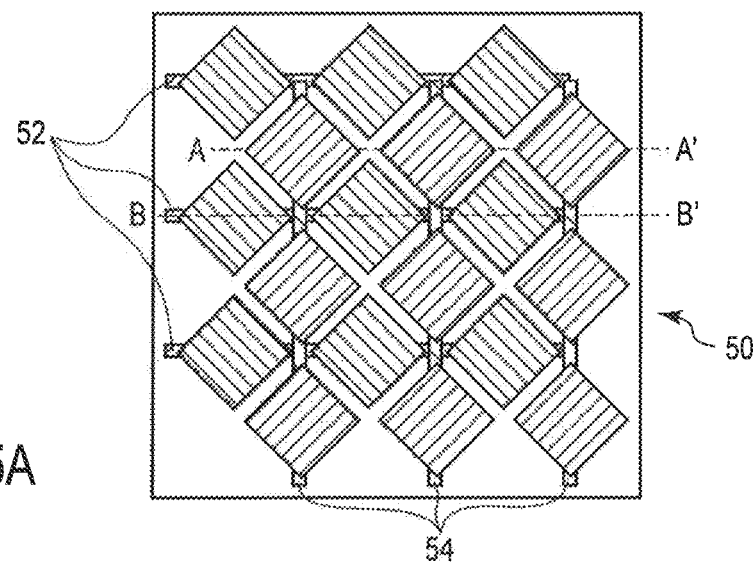
FIG. 5A is a schematic view showing a plane of a coordinate panel according to another embodiment.
Figure 5B:
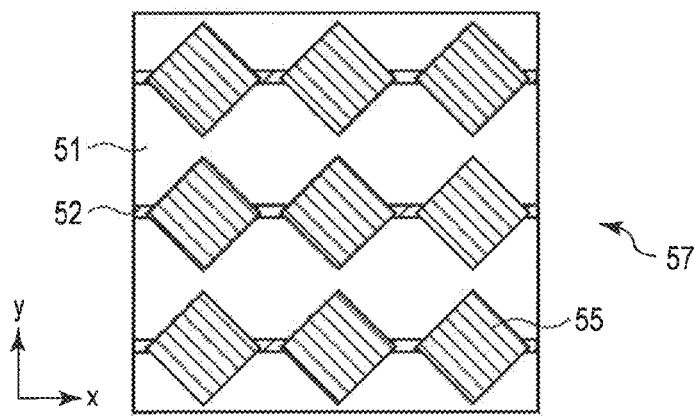
FIGS. 5B and 5C are schematic plan views of wiring boards of the coordinate panel shown in FIG. 5A.
Figure 5C:
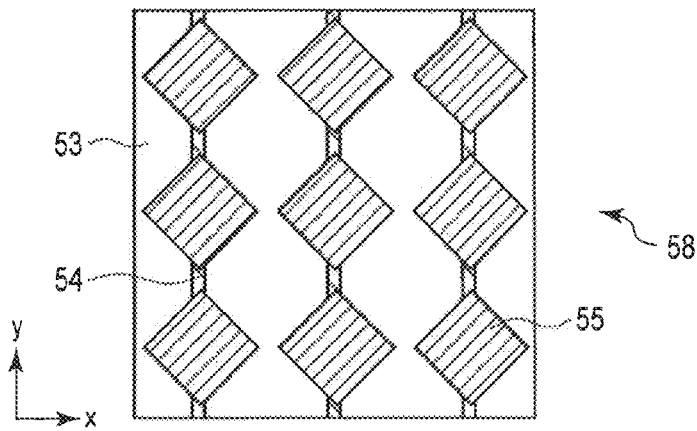
Figure 6A:
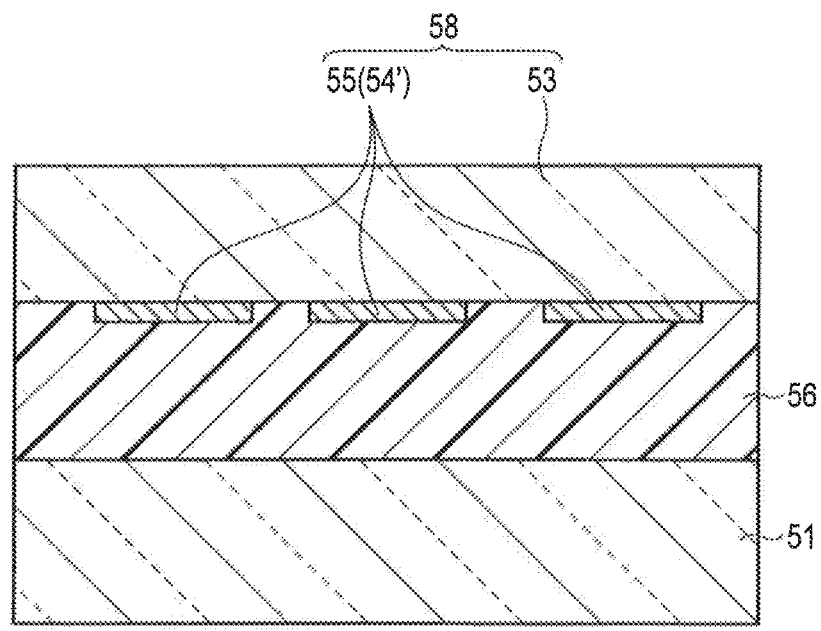
FIGS. 6A and 6B are schematic cross-sectional views of the coordinate panel shown in FIG. 5A.
Figure 6B:
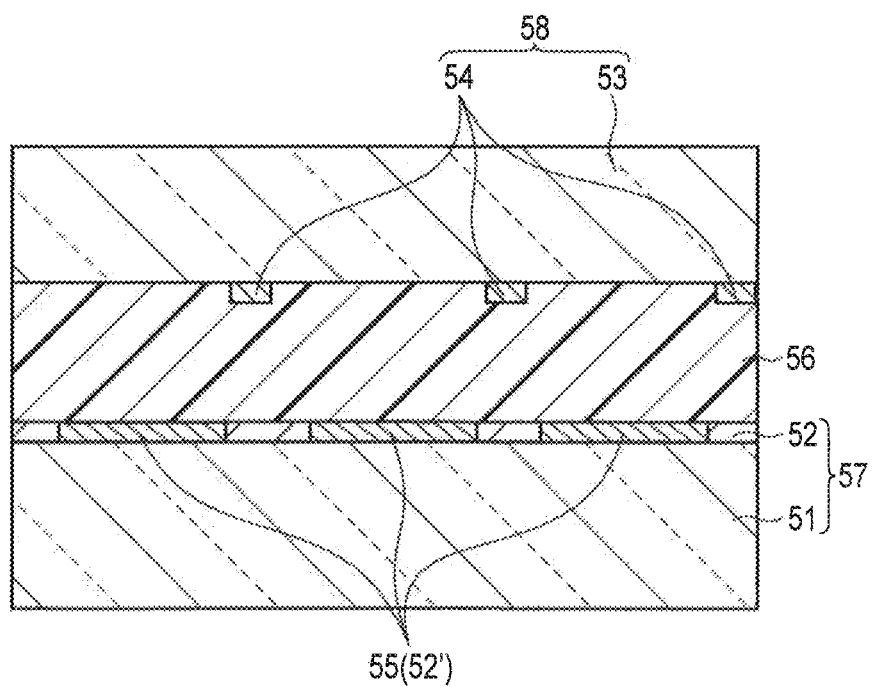

With reference to FIGS. 5A to 5C, 6A and 6B, a coordinate panel according to another embodiment will be described. FIG. 5A describes the configuration of the plane of the coordinate panel. FIGS. 5B and 5C are respectively plan views of a first wiring board and second wiring board. FIGS. 6A and 6B show cross-sectional views of the coordinate panel. FIG. 6A is a cross-sectional view taken along A-A' in FIG. 5A. FIG. 6B is a cross-sectional view taken along B-B' in FIG. 5A.

A coordinate panel 50 shown in FIGS. 5A to 5C, 6A and 6B includes: a first wiring board 57 including a first transparent substrate 51 and a first conductive layer 52 disposed on the first transparent substrate 51, the first conductor layer 52 being patterned to extend in a first direction; a second wiring board 58 including a second transparent substrate 53 and a second conductive layer 54 disposed on the second transparent substrate 53, the second conductive layer 54 being spaced apart from and faced to the patterned first conductive layer, and patterned to extend in a second direction crossing the first direction; and an electrical insulating resin layer 56 that is in contact with the first substrate 51, the first conductive layer 52, the second transparent substrate 53, and the second conductive layer 54. Each of the first conductive layer 52 and the second conductive layer 54 includes a metal nanowire layer including a plurality of metal nanowires and a graphene oxide layer covering the metal nanowire layer.

As shown in the plan view of FIG. 5A to 5C, the coordinate panel includes an x electrode 52 extending in an x direction and a y electrode 54 extending in a y direction crossing the x direction. A pad 55 consists of parts 52' of an x wiring 52 and parts 54' of a y wiring 54 as shown in FIGS. 6A and 6B.

The first wiring board 57 includes the first transparent substrate 51 and the plurality of x wirings 52 disposed on the first transparent substrate 51. The second wiring board 58 includes the second transparent substrate 53 and the plurality of y wirings 54 disposed on the second transparent substrate 53. The x wiring 52 and the y wiring 54 are separated by the electrical insulating resin layer 56. The transparent substrate as already described is used as the first substrate 51 and the second substrate 53. The transparent resin as already described is used for the electrical insulating resin layer 56.

The x wiring 52 and the y wiring 54 include a metal nanowire layer including a plurality of metal nanowires and a graphene oxide layer covering the metal nanowire layer. The x wiring 52 and the y wiring 54 can be said to be patterned conductive layers. The antireflection layer and hard coat layer described above are preferably provided on the surface of the coordinate panel 50 (surfaces of the first base substrate 51 and second base substrate 53). The circumference of the coordinate panel 50 is preferably sealed to prevent the invasion of corrosive gas.

The coordinate panel of the present embodiment is suitable as an electrostatic capacitive touch panel. A thermoplastic or curing resin can be used in order to form the electrical insulating resin layer.

Hereinafter, specific examples of each embodiment will be shown.

Example 1

A light-emitting device 30 shown in FIG. 3 is produced by the following method.

A surface of a PET film, as the first substrate, is made slightly hydrophilic by a UV ozone treatment. Silver nanowires (average diameter: 40 nm, length: 20 to 80 µm) manufactured by Nano Meet, as the metal nanowires, are dispersed in methanol to prepare a 0.2 mg/ml methanol dispersion. The obtained dispersion is applied by a spray method through a mask onto the PET film held at 80° C. to obtain a wiring pattern. Furthermore, this is dried at 60° C. for 10 minutes to produce a silver nanowire layer. The sheet resistance of the silver nanowire layer measured by a four Probe method is about 10 Ω/□.

An ethanol dispersion of graphene oxide is applied onto the silver nanowire layer. The graphene oxide has a particle diameter of 500 nm to 3 µm, is produced from graphite, and has a ratio (O/C) of oxygen atoms to carbon atoms of 120%. About ten layers of the ethanol dispersion of graphene oxide are applied onto the entire silver nanowire layer and dried at 60° C. for 10 minutes to obtain a graphene oxide layer. The sheet resistance of a complex including the metal nanowire layer and the graphene oxide layer is decreased to about 7Ω/□ by this procedure.

The number of the graphene oxide layers can be determined as follows. The graphene oxide is reduced by hydrazine to convert the graphene oxide into graphene. When the graphene layer is irradiated with light of 550 nm, 2.3% of the light is absorbed per graphene layer. The number of the graphene oxide layers is determined by comparing the absorption amount of light at 550 nm between the graphene oxide layer and graphene layer. This method is a destructive inspection since the graphene oxide layer is converted into a graphene layer.

The complex formed on the PET film as described above serves as a lower electrode. An upper electrode is separately formed on a PET film by the same procedure as described above.

SEM images of the obtained complex are shown in FIGS. 7A and 7B. FIG. 7A shows a surface SEM image. FIG. 7B shows a cross-sectional SEM image. As shown in FIG. 7A, a plurality of silver nanowires 12a are covered with a graphene oxide layer 13. Silver nanoparticles 16 having diameters of about 10 nm is present on one surface. The cross-sectional SEM image of FIG. 7B shows that the silver nanowires 12a are three-dimensionally stacked. The graphene oxide layer cannot be distinguished in the cross-sectional SEM image. In addition, since silver nanoparticles are not observed, most of the silver nanoparticles are considered to be present on the outermost surface of the graphene oxide layer.

The Pt—Pd layer shown in FIG. 7B has been separately vapor-deposited in order to distinguish the outermost surface. The re-deposition layer is one that has formed due to the re-adhesion of sample material sputtered by an ion beam while producing the sample cross-section. Although the image is not clear, a slight gap is observed at the interface between the silver nanowire layer 12, which includes a plurality of silver nanowires 12a, and the Pt—Pd layer. Graphene oxide layer is considered to be present also in the gap.

By providing the graphene oxide layer on the silver nanowire layer, the hydrophilicity of the surface is increased, thereby increasing the spread area of water by about 50%. Furthermore, resistance to sulfur vapor is also enhanced. When the graphene oxide layer is not provided, leaving the silver nanowire layer for 15 minutes at 80° C. in the presence of sulfur vapor results in the sheet resistance of the silver nanowire layer to significantly increase by $10^6 \Omega/\square$ or more. Meanwhile, when the graphene oxide layer is provided, the sheet resistance of the silver nanowire layer increases only by about $10^2 \Omega/\square$, even if the silver nanowire layer is left at 80° C. for 15 minutes.

A red LED chip having a pair of electrodes on its top and bottom sides is prepared as a light-emitting element. The LED chip is pressed onto the lower electrode. An acrylic ultraviolet curing resin is applied onto the entire lower electrode having the LED chip to form an electrical insulating resin layer. The upper part of the LED chip is washed with an organic solvent.

A PET film having an upper wiring is laminated onto the LED chip so that the upper wiring and a lower wiring cross each other at the position of the LED chip, and then the entire laminate stack is irradiated with ultraviolet light. Then, the light emitting device of the present example is obtained by most-annealing at 60° C.

The light-emitting device of the present example exhibits bright light emission observed under conditions of a direct current of 15 to 20 mA at 2.0 V, and has high transparency. The light-emitting device of the present example is excellent in resistance to repetitive bending, peeling, and impurities. In addition, the light-emitting device is low in electrical resistance as described above, and can be produced at low cost.

Example 2

A light-emitting device 40 shown in FIG. 4 is produced by the following method.

A surface of a PET film, as the first substrate, is made slightly hydrophilic by a UV ozone treatment. Furthermore, a polyvinyl alcohol-based hydrophilic binder resin is applied to form a binder layer. A 2 mg/ml ethanol dispersion of silver nanowires (average diameter: 35 nm, average length: 15 μm) manufactured by Blue Nano is applied onto the binder layer by a bar coater. This is dried at 60° C. for 10 minutes to produce a silver nanowire layer.

About 20 layers of the same ethanol dispersion of graphene oxide as that in Example 1 are applied onto the entire silver nanowire layer and dried at 60° C. for 10 minutes to obtain a graphene oxide layer. The silver nanowire layer and the graphene oxide layer are stacked to form a conductive layer. This conductive layer is patterned by an yttrium aluminum garnet laser (NAG laser) to obtain a wiring.

A blue LED chip having a pair of electrodes on one surface is prepared as a light-emitting element. The LED chip is pressed and placed on the wiring obtained above. An acrylic ultraviolet curing resin is applied onto the entire wiring having the LED chip to form an electrical insulating resin layer. A PET film, as the second support, is laminated on the electrical insulating resin layer, and then the entire laminate stack is irradiated with ultraviolet light. Finally, the light-emitting device of the present example is obtained by post-annealing at 60° C.

The light-emitting device of the present example exhibits bright light emission observed under conditions of a direct current of 15 to 20 mA at 3.7 V, and has high transparency. The light-emitting device of the present example is low in electrical resistance, and excellent in resistance to repetitive bending, peeling, and impurities. The light-emitting device can be produced at low cost.

Example 3

A light-emitting device 40 shown in FIG. 4 is produced by the following method.

About ten layers of the same ethanol dispersion of graphene oxide as that in Example 1 are applied onto an entire surface of a PET film, as the first substrate, and dried at 60° C. for 10 minutes. Thereby, a lower graphene oxide layer is obtained as a binder layer. Silver nanowires (average diameter: 40 nm) manufactured by Nano Meet, as the metal nanowires, are dispersed in methanol to prepare a 2 mg/ml methanol dispersion. The obtained dispersion is applied onto the lower graphene oxide layer by a bar coater. This is dried at 60° C. for 10 minutes to produce a silver nanowire layer.

As a raw material for an upper graphene oxide layer, there is prepared an aqueous dispersion of graphene oxide, the graphene oxide being produced from graphite and having a ratio (O/C) of oxygen atoms to carbon atoms of 37% and a particle diameter of 300 nm to 1 μm (containing 0.4% by weight of ammonia). About ten layers of the aqueous dispersion are applied onto the entire silver nanowire layer and dried at 90° C. for 20 minutes to obtain the upper graphene oxide layer. An N/C atom ratio determined from XPS is 3 to 4%. The lower graphene oxide layer, the silver nanowire layer, and the upper graphene oxide layer are stacked to obtain a conductive layer. This conductive layer is patterned by a YAG laser to obtain a wiring.

A blue LED chip having a pair of electrodes on one surface is prepared as a light-emitting element. The LED chip is pressed and placed on the wiring obtained above. An acrylic ultraviolet curing resin is applied onto the entire wiring having the LED chip to form an electrical insulating resin layer. A PET film, as the second support, is laminated on the electrical insulating resin layer, and then the entire laminate stack is irradiated with ultraviolet light. Finally, the light-emitting device of the present example is obtained by post-annealing at 60° C.

The light-emitting device of the present example exhibits bright light emission observed under conditions of a direct current of 15 to 20 mA at 3.6 V, and has high transparency. The light-emitting device of the present example is low in electrical resistance, and excellent in resistance to repetitive bending, peeling, and impurities. The light-emitting device can be produced at low cost.

Example 4

A coordinate panel 50 shown in FIG. 5A is produced by the following method.

A surface of a PET film, as the first substrate, is made slightly hydrophilic by a UV ozone treatment. Furthermore, a polyvinyl alcohol-based hydrophilic binder resin is applied onto the surface of the PET film to form a binder layer. Silver nanowires (average diameter: 40 nm) manufactured by Nano Meet, as the metal nanowire, are dispersed in methanol to prepare a 2 mg/ml methanol dispersion. The obtained dispersion is applied onto the binder layer by a bar coater. This is dried at 60° C. for 10 minutes to produce a silver nanowire layer.

About 20 layers of the same ethanol dispersion of graphene oxide as that in Example 1 are applied onto the entire silver nanowire layer and dried at 60° C. for 10 minutes to obtain a graphene oxide layer. The silver nanowire layer and the graphene oxide layer are stacked to form a conductive layer. This conductive layer is patterned by a YAG laser to form an x wiring and a pad in the x wiring, thereby obtaining a first wiring board. A conductive, layer is formed on a PET film by the same procedure as described above, and processed by a YAG laser. Thus, a y wiring and a pad in the y wiring are formed to obtain a second wiring substrate.

An acrylic ultraviolet curing resin is applied onto the entire PET film (first wiring board) on which the x wiring is produced, to form an electrical insulating resin layer. The PET film (second wiring board) on which the y wiring is formed is laminated on the electrical insulating resin layer so that the pads are shifted from each other, and the entire laminate stack is irradiated with ultraviolet light. Then, the coordinate panel used for a capacitive touch panel is obtained by post-annealing at 60° C.

The coordinate panel of the present example is excellent in resistance to repetitive bending, peeling, and impurities. The coordinate panel can be produced at low cost.

Example 5

A light-emitting device 30 shown in FIG. 3 is produced by the following method.

A silver nanowire layer and a graphene oxide layer are produced on the surface of a PET film, as the first substrate, in the same manner as in Example 1. Next, the graphene oxide layer is brought into contact with hydrazine hydrate vapor for 10 minutes at 90° C. Therefore, a part of graphene oxide is reduced, and nitrogen atoms are introduced. An N/C atom ratio determined, from XPS is 0.3 to 0.5%.

A complex formed on the PET film as described above serves as a lower electrode. An upper electrode is separately formed on a PET film by the same procedure as described above.

A red LED chip having a pair of electrodes on its top and bottom sides is prepared as a light-emitting element. The LED chip is pressed and placed on the lower electrode. An acrylic ultraviolet curing resin is applied onto the entire lower electrode having the LED chip to form an electrical insulating resin layer. The upper part of the LED chip is washed with an organic solvent.

A PET film having an upper wiring is laminated onto the LED chip so that the upper wiring and a lower wiring cross each other at the position of the LED chip, and then the entire laminate stack is irradiated with ultraviolet light. Then, the light-emitting device of the present example is obtained by post-annealing at 60° C.

The light-emitting device of the present example exhibits bright light emission observed under conditions of a direct current of 15 to 20 mA at 2.0 V, and has high transparency. The light-emitting device of the present example is excellent in resistance to repetitive bending, peeling, and impurities. In addition, the light-emitting device is low in electrical resistance as described above, and can be produced at low cost.

Example 6

A light-emitting device 40 shown in FIG. 4 is produced by the following method.

Graphene oxide having a particle diameter of 200 to 500 nm and an O/C atom ratio of 57% is used as the graphene oxide. A 1 mg/ml methanol dispersion of silver nanowires (average diameter 110 nm, average length: 30 µm) manufactured by Seashell Technology is used. In all other respects, a light-emitting device is produced in the same manner as in Example 2.

The light-emitting device of the present example exhibits bright light emission observed under conditions of a direct current of 15 to 20 mA at 2.0 V, and has high transparency. The light-emitting device of the present example is excellent in resistance to repetitive bending, peeling, and impurities. In addition, the light-emitting device is low in electrical resistance as described above, and can be produced at low cost.

Example 7

A light-emitting device 40 shown in FIG. 4 is produced by the following method.

A surface of a PET film, as the first substrate, is made slightly hydrophilic by a UV ozone treatment. Furthermore, a polyvinyl alcohol-based hydrophilic binder resin is applied to the surface of the PET film to form a binder layer. A 2 mg/ml ethanol dispersion of silver nanowires (average diameter: 35 nm, average length: 15 µm) manufactured by Blue Nano is applied onto the binder layer by a bar coater. This is dried at 60° C. for 10 minutes to produce a silver nanowire layer.

About 20 layers of the same ethanol dispersion of graphene oxide as that in Example 1 are applied onto the entire silver nanowire layer and dried at 60° C. for 10 minutes to obtain a graphene oxide layer. The silver nanowire layer and the graphene oxide layer are stacked to form a conductive layer. This conductive layer is patterned by a YAG laser to obtain a wiring.

A thermoplastic acrylic elastomer film is prepared. A through-hole corresponding to an LED chip is opened in the thermoplastic acrylic elastomer film. The acrylic elastomer film is adhered on a conductive layer so that the through-hole is positioned on a pair of wiring electrodes. A blue LED chip having a pair of electrodes on one surface is prepared as a light-emitting element. The LED chip is pressed into the through-hole obtained above, and placed on the pair of wirings. A PET film, as the second support, is laminated thereon, followed by heating, thereby obtaining the light-emitting device of the present example.

The light-emitting device of the present example exhibits bright light emission observed under conditions of a direct current of 15 to 20 mA at 3.7 V, and has high transparency. The light-emitting device of the present example is low in electrical resistance, and is excellent in resistance to repetitive bending, peeling, and impurities. The light-emitting device can be produced at low cost.

According to the embodiments described above, a transparent conductor that is low in electrical resistance is provided, in which the transparent conductor has high transparency, is excellent in resistance to bending, peeling, and impurities, and is obtainable at low cost, the transparent conductor comprising: a transparent substrate; a metal nanowire layer disposed on the transparent substrate and comprising a plurality of metal nanowires; a graphene oxide layer covering the metal nanowire layer; and an electrical insulating resin layer disposed in contact with the graphene oxide layer.

While certain embodiments have been described, these embodiments have been presented by way of example only, and are not intended to limit the scope of the inventions. Indeed, the novel, methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A transparent conductor comprising:
   a transparent substrate;
   a metal nanowire layer disposed on the transparent substrate and comprising a plurality of metal nanowires, the metal nanowires comprising fused metal nanowires;
   a first graphene oxide layer covering the metal nanowire layer;
   an electrical insulating resin layer disposed in contact with the graphene oxide layer, and
   further comprising a second graphene oxide layer interposed between the transparent substrate and the metal nanowire layer.

2. The transparent conductor according to claim 1, wherein a stack comprising the metal nanowire layer, the first and second graphene oxide layers, and the electrical insulating resin layer has a patterned form.

3. The transparent conductor according to claim 1, wherein the first and second graphene oxide layers comprises metal nanoparticles therein or thereon.

4. The transparent conductor according to claim 1, wherein the metal nanowires are silver nanowires.

5. The transparent conductor according to claim 1, wherein the electrical insulating resin layer comprises a resin having a polar group.

6. A transparent conductor comprising:
   a transparent substrate;
   a metal nanowire layer disposed on the transparent substrate and comprising a plurality of metal nanowires, the metal nanowires comprising fused silver nanowires;
   a graphene oxide layer covering the metal nanowire layer and comprising metal nanoparticles therein or thereon, the metal nanoparticles being made of silver; and
   an electrical insulating resin layer disposed in contact with the graphene oxide layer.

* * * * *